(12) United States Patent
Simon et al.

(10) Patent No.: US 6,768,203 B1
(45) Date of Patent: Jul. 27, 2004

(54) OPEN-BOTTOMED VIA LINER STRUCTURE AND METHOD FOR FABRICATING SAME

(75) Inventors: Andrew H. Simon, Fishkill, NY (US); Cyprian E. Uzoh, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 1459 days.

(21) Appl. No.: 09/262,690

(22) Filed: Mar. 4, 1999

Related U.S. Application Data

(62) Division of application No. 08/767,572, filed on Dec. 16, 1996, now Pat. No. 5,933,753.

(51) Int. Cl.[7] .............................................. H01L 23/48
(52) U.S. Cl. ........................ 257/774; 257/771; 257/761; 257/762
(58) Field of Search ................................. 257/761, 762, 257/751, 774

(56) References Cited

U.S. PATENT DOCUMENTS

| | | | | |
|---|---|---|---|---|
| 4,141,020 A | * | 2/1979 | Howard et al. ................ | 357/15 |
| 4,158,613 A | * | 6/1979 | Sogo ............................. | 204/15 |
| 4,680,612 A | * | 7/1987 | Hieber et al. .................. | 357/71 |
| 4,829,363 A | * | 5/1989 | Thomas et al. ................ | 357/71 |
| 4,985,750 A | * | 1/1991 | Hoshino ........................ | 357/71 |
| 5,436,504 A | * | 7/1995 | Chakravorty et al. ........ | 257/758 |
| 5,444,302 A | * | 8/1995 | Nakajima et al. ............ | 257/755 |
| 5,471,092 A | * | 11/1995 | Chan et al. ................... | 257/753 |
| 5,525,837 A | * | 6/1996 | Choudhury ................... | 257/751 |
| 5,686,760 A | * | 11/1997 | Mikayawa .................... | 257/751 |
| 5,801,444 A | * | 9/1998 | Aboelfotoh et al. ......... | 257/762 |

FOREIGN PATENT DOCUMENTS

| | | | | |
|---|---|---|---|---|
| EP | 000161981 | * | 11/1985 | ................ 257/761 |
| EP | 000163830 | * | 12/1985 | ................ 257/761 |

OTHER PUBLICATIONS

Revitz et.al. , Metallurgy Barrier for Au and Pb, IBM Technical Disclosure Bulletin, Apr. 1972.*

* cited by examiner

*Primary Examiner*—Allan R. Wilson
*Assistant Examiner*—Edgardo Ortiz
(74) *Attorney, Agent, or Firm*—RatnerPrestia; Lisa Ulrich, Esquire

(57) ABSTRACT

This invention relates to a method of forming a bottomless liner structure. The method involves the steps of first obtaining a material having a via. Next, a first layer is deposited on the material, the first layer covering the sidewalls and bottom of the via. Finally, a second layer is sputter deposited on the first material, the material Rf biased during at least a portion of the time that the second layer is sputter deposited, such that the first layer deposited on the bottom of the via is substantially removed and substantially all of the first layer deposited on the sidewalls of the via is unaffected.

17 Claims, 2 Drawing Sheets

OPEN-BOTTOMED VIA LINER STRUCTURE AND METHOD FOR FABRICATING SAME

CROSS-REFERENCE TO RELATED APPLICATION

This application is a Divisional of U.S. patent application Ser. No. 08/767,572, filed Dec. 16, 1996 now U.S. Pat. No. 5,933,753.

FIELD OF THE INVENTION

This invention relates to the formation of structures which form barrier or liner layers in semiconductor devices. More particularly, this invention relates to the formation of liner structures which create insulation and diffusion barriers at the sidewalls of a via but not the bottom of a via.

BACKGROUND OF THE INVENTION

A semiconductor chip contains an array of devices whose contacts are interconnected by patterns of conductive wires. In order to take full advantage of the device and circuit density on a given chip, it is usually necessary to make interconnections among the various devices and circuit elements in the chip. However, due to the level of integration of devices and circuits on a chip, interconnections can no longer be made by means of a single level network of conductive lines. Often, it is necessary to form two or more such levels of conductive lines which are vertically spaced apart and separated by intermediate insulating layers.

Connections can made between the different levels of conductive lines by means of vias which are etched through the insulating layers separating the levels. The vias are filled with metal to form via studs. These multiple levels of conductor wiring interconnection patterns, with the individual levels connected by via studs, operate to distribute signals among the circuits on the chip.

In its simplest form, a via may be formed by first masking an insulating layer with photoresist and then selectively etching a portion of the insulating layer. The via is etched through an opening formed in the photoresist using well known photolithographic techniques, to form an opening to the underlying conductive layer. Depending on the aspect ratio and the interconection ground rules, isotropic or anisotropic etching processes may be used to form a hole in the dielectric.

After the via etch, and photoresist removal, it is possible to deposit a conductive layer in the via. Conducting material is deposited in the via to form the electrical interconnect between the conducting layers. However, a liner layer is usually desirable between the insulating and conductive layers.

The presence of a liner layer on the sidewalls of the via is desirable because structural delamination and conductor metal diffusion can occur unless there is a layer of protection, a liner layer, between the conductive layer and the etched insulating layer. However, the best liner materials tend to be more resistive, as compared to conducting materials, so the presence of the liner at the bottom of the via increases the contact resistance of the structure. An increase in contact resistance is not desirable because it will lead to slower propagation of electrical signals through the wiring structure. For structural integrity, the liner layer should line the entire side wall and will generally cover the bottom of the via as well.

The liner and conductive layers may be deposited by sputtering, CVD, electroless deposition and electrodeposition. Rf bias sputtering, in general, is known in the art and involves the reemission of material during the sputter deposition thereof through the effects of attendant ion bombardment of the layer being deposited. In effect, Rf biased sputtering is the positive ion bombardment of a substrate or film during its deposition. Therefore, during Rf bias sputtering, there is always simultaneous etching and deposition of the material being deposited. Previously deposited layers are not etched as part of a standard Rf biased sputter deposition.

During Rf biased sputtering, particles are bombarded onto a target material so as to sputter the target material onto the semiconductor wafer substrate. During the process the ions being deposited also bombard the semiconductor substrate so that the substrate can have a smooth surface.

Materials capable of forming a liner layer generally have a higher resistance than conductive materials. Liner materials have generally been selected to simultaneously minimize contact resistance, provide adequate adhesion between insulative and conductive metal and provide a good diffusion barrier. The contact resistance problem is compounded when copper is used as the conductive metal. When copper is used, the presence of a continuous dissimilar liner material with comparatively higher resistivity at the bottom of the via deters the fabrication of a single crystalline, or continuous, interface between the via conductor material and the wiring level below. The formation of a single, crystalline interface is advantageous. The single crystalline structure provides greater structural integrity for the interface between the via and the wiring level below. For example, the deposition of a seed layer of copper prior to the electroplating of copper creates an environment that is more conducive to electroplating. The copper seed layer facilitates the formation of a single crystalline copper structure at the via-metal interface because the seed layer is structurally similar to the electroplated metal.

The prior art does not teach a method of selectively Rf biasing, during a sputter deposition, such that a deposited, liner layer is substantially removed from the bottom of the via while the deposited material on the sidewalls of the via is substantially unaffected. A method of providing such a structure is needed to facilitate the creation of continuous copper vias and conductive metal lines.

Thus there remains a need for a method of creating a via structure that is more conducive to electroless deposition and electrodeposition, especially copper electroplating; and a structure that has a liner material present on the sidewalls of the via but not the bottom of the via.

BRIEF SUMMARY OF THE INVENTION

It is therefore an object of the present invention to provide a method of forming a via with liner material on the sidewalls of the via but not the bottom of the via, i.e., a bottomless via.

It is another object of the present invention to provide a method of forming a bottomless via with a second material deposited on sidewalls of the via but not on the bottom of the via.

It is a further object of the present invention to provide an environment more conducive to the copper electroplating.

These and other features, aspects, and advantages will be more readily apparent and better understood from the following detailed description of the invention, which describes a method of forming a bottomless liner structure, comprising:

a) obtaining a material having a via;

b) depositing a first layer on the material having the via, the first layer covering the sidewalls and bottom of the via;

c) sputter depositing a second layer, the material Rf biased during at least a portion of the time that the second layer is sputter deposited, such that the first layer deposited on the bottom of the via is substantially removed and substantially all of the first layer deposited on the sidewalls of the via is unaffected.

DETAILED DESCRIPTION OF THE PREFERRED EMBODIMENT

The present invention comprises a method for depositing a liner layer for a via structure where there is a lining present only on the sidewalls in the final structure. In this way, the via bottom is open for low resistance contact to the wiring level below.

Figure 1A:
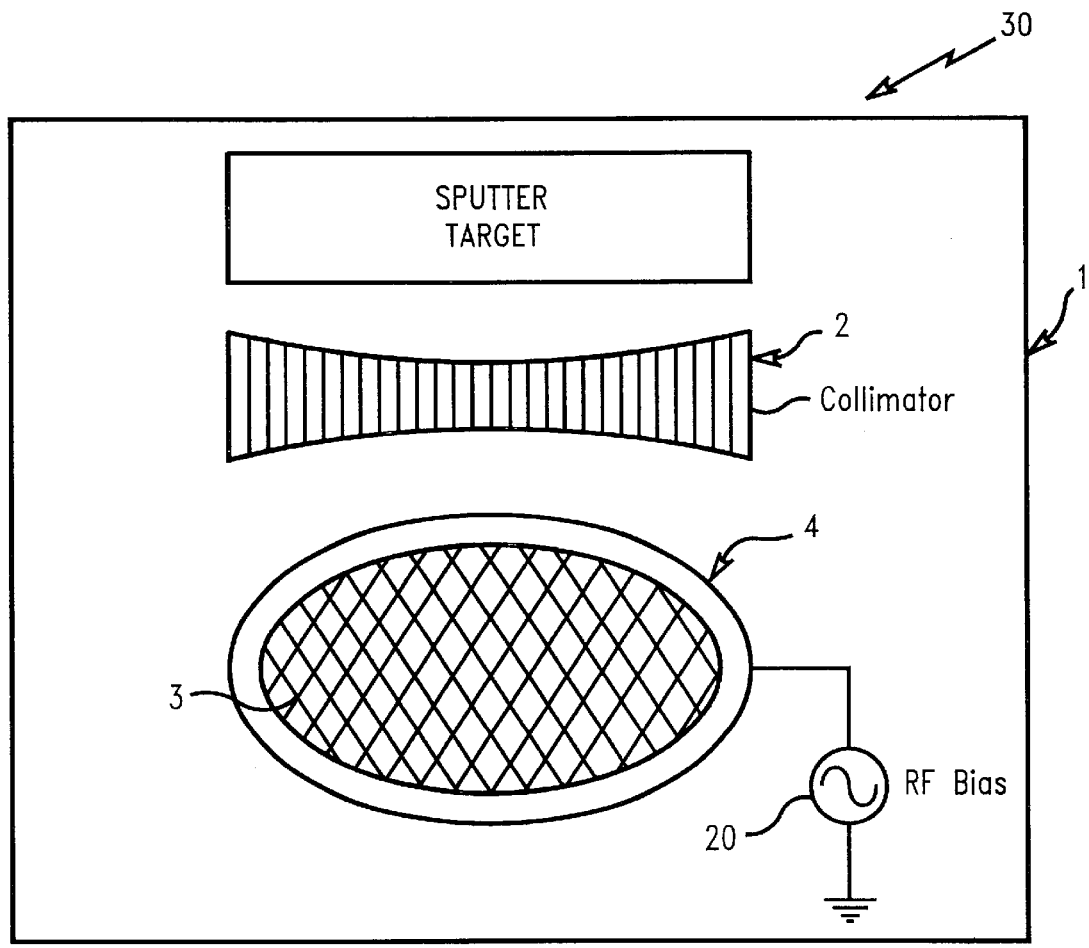
FIG. 1a is a schematic view of a desirable structure for a sputter deposition apparatus.
Figure 1B:
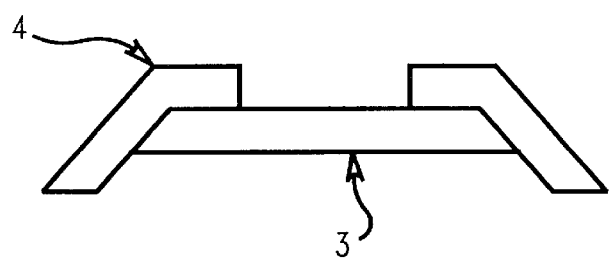
FIG. 1b is a schematic view of the relationship between the material and the desirable sputter deposition apparatus.

Referring to the Figures in more detail, and particularly referring to FIGS. 1a and 1b, a desirable apparatus, generally indicated by 30, to carry out the method of the present invention is shown in FIG. 1. Apparatus 30 includes a metal deposition chamber, 1. The chamber, 1, is configured with a collimator, 2, as well as a clamp ring wafer chuck, 4, that enables the wafer, 3, to be subjected to Rf bias, 20, during deposition. The clamp ring wafer chuck, 4, is in contact with the wafer, 3, as shown in FIG. 1b.

The apparatus configuration is meant as an example of an structure that is capable of carrying out the method of the present invention. Other apparatus configurations do exist and the process of this invention is not dependent on the apparatus configuration shown in FIGS. 1a and 1b.

Both embodiments of the invention have certain common process conditions. Some of the parameters affecting the apparatus described in FIGS. 1a and 1a are substantially the same for either embodiment. In a preferred embodiment, the Rf bias voltage, Rf bias discharge, gas used, and gas pressure are controlled. In a more preferred embodiment, the gas used should be an inert gas; and in an even more preferred embodiment, the gas would be argon.

The total deposition time and Rf duty factor are variables in both embodiments of the process of this invention. The total deposition time is a function of the material to be Rf bias sputter deposited, the desired thickness of the sputter deposited material, and the size and aspect ratio of the via.

The portion of time that the Rf biasing should be active is a factor of three variables. The variables are $T_{tot}$, $T_{rfon}$ and $T_{rfoff}$. $T_{tot}$ is the total amount of time of the sputter deposition process, the total deposition time. $T_{rfon}$ is the time during the sputter deposition step where the Rf biasing is turned on or becomes active. $T_{rfoff}$ is the time at which the Rf biasing is turned off, after the Rf biasing has been turned on, during the sputter deposition step. The parameters wherein the process of this invention is most effective are given by:

1) $0.50 \leq T_{rfon}/T_{tot} \leq 0.75$
2) $0.75 \leq T_{rfoff}/T_{tot}$
3) $(T_{rfoff} - T_{rfon})/T_{tot} \geq 0.18$ The first two equations given above show the relationship between the Rf biasing on/off times and the total deposition time. $(T_{rfoff} - T_{rfon})$ gives the duty factor of the Rf biasing portion of the sputter deposition. The duty factor is the length of time that the Rf biasing is on or active. The third equation given above shows that the duty factor of the Rf biasing must be at least about 18% of the total deposition time to achieve the structures that are the result of the process of this invention.

Figure 2A:
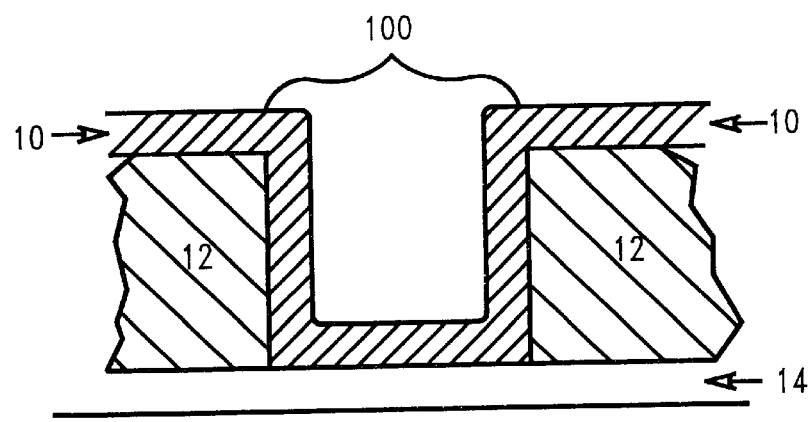
FIG. 2a is an intermediate structure produced while performing the method of this invention.

The process of the present invention creates a final structure that has a liner layer present on the sidewalls of a via, but not on the bottom of the via. In the process of this invention, a first layer, 10, shown in FIG. 2a, is first deposited by any means known in the art into a via, 100. The first layer, 10, covers the via, 100. The first layer, 10, should contain a material capable of lining the via so as to prevent the diffusion of later deposited materials into the insulative layer, 12. In this instance, the insulative layer, 12, lies on a material capable of acting as a metallic layer, 14. Generally, the via, 100, will extend through the insulative layer, 12, to the underlying metallic layer, 14.

Figure 2B:
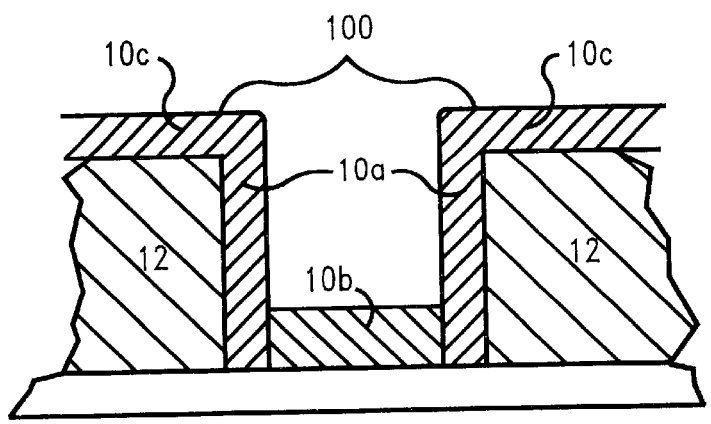
FIG. 2b is a view similar to FIG. 2a but showing details of the different segments of the intermediate structure.

The first layer, 10, from FIG. 2a, in this case a liner layer, is shown in detail in FIG. 2b. The liner layer generally indicated by 10, is comprised of a sidewall liner, bottom liner, 10b, and surface liner, 10c. The surface liner, 10c, can be removed if desired by any means known in the art. The liner material covering the sidewalls, 10a, must extend to the floor of the via because a complete barrier must exist between the insulative material 12, and any subsequently deposited material within via 100. Materials capable of lining the via include, but are not limited to, titanium, titanium nitride, tungsten, tantalum, TaN, TaN/Ta, Ta/TaN, and Ta/TaN/Ta.

The method of this invention creates an environment where the conductive qualities of the liner material are no longer a factor in the choice of the liner material. Historically, the insulative qualities of a potential liner material could result in an individual material making a poor liner material choice because of the increase in contact resistance. Since the liner material is not present on the bottom of the via it does not act as an obstacle to electrical signal propagation. The insulative properties of a liner material are therefore no longer a significant factor in the selection of a liner material. Other design factors can now dictate the choice of liner material. Insulative and semiconducting materials, in addition to those listed above, can now be used, if desired, as liner materials since their nonconductive properties will not affect the propagation of electrical signals.

FIGS. 2a and 2b represent intermediate structures which will be further processed as described hereafter.

Figure 3:
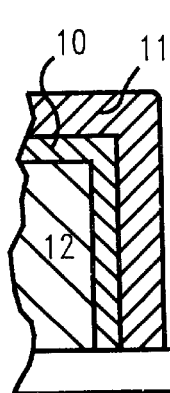
FIG. 3 shows a final structure achieved by the method of the invention wherein the bottom of the via does not contain either the deposited first or second layer.
Figure 4:
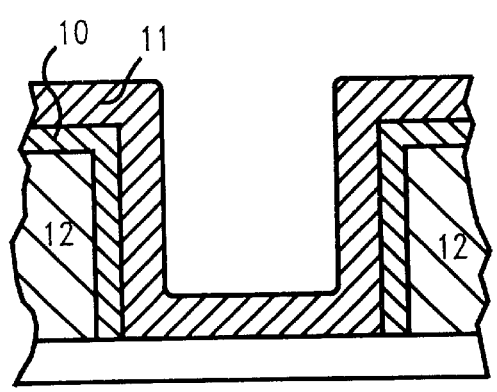
FIG. 4 shows a final structure achieved by the method of the invention wherein the bottom of the via does not contain the deposited first layer.

FIGS. 3 and 4 show alternative final structures created by the different embodiments of the method of this invention. In FIG. 3, a second layer, 11, is deposited on the first layer,

10, using an Rf bias sputter deposition. The second deposition is sputter deposited. The sputter deposition process conditions must be selected such that the previously deposited layer, here a liner layer, 10, coating the bottom of the via is "substantially removed" but "substantially all" of the previously deposited liner layer lining the sidewalls remains after the sputter deposition. By "substantially removed" it is meant that the amount of first deposited material remaining on the bottom of the via, 100, after the sputter deposition is insufficient to significantly effect the electrical and capacitive potential of the final structure. By "substantially all" it is meant that the amount of first deposited material remaining on the sidewalls of the via after the later deposited sputter deposition is sufficient to prevent the diffusion of the conductive material into the insulative layer.

Additionally, in FIG. 3, the sputter deposited second layer, 11, is substantially removed from the bottom of the via but substantially all of the sputter deposited second layer, 11, remains on the sidewalls. The sputter deposited second layer, 11, could be a material that makes the via structure more conducive to the deposition of the metallization necessary for multi-level communication, or it could be the metallization itself.

In FIG. 4, a second deposition is conducted to sputter deposit the second layer, 11. The second deposition is sputter deposited using an Rf bias. The Rf biased sputter deposition process conditions must be selected such that the previously deposited liner layer, 10, coating the bottom of the via, 100, is substantially removed but substantially all of the liner material lining the sidewalls remains. In FIG. 4, the Rf biased sputter deposited second layer remains in the bottom of the via as well as the sidewalls of the via. The second layer can be any material but in the method and structure of the present invention it is copper.

EXAMPLE 1

In this example the process parameters lead to the final structure shown in FIG. 4, where the second, sputter deposited, layer, 11, is present on the sidewalls and the bottom of the via. The first layer, the liner layer, 10, is TaN/Ta and has been deposited by any means known in the art. The second, Rf bias sputtered deposited layer, 11, is copper. The sputter deposition of the copper creates a seed layer. A continuous copper structure can then be formed on top of the second layer, 11, by any means known in the art. The Rf bias voltage for the sputter deposition is about 160V. The Rf bias discharge is about 1 KW. The gas used in the sputter deposition process is argon and the argon pressure is about 5 mTorr. The total deposition time, $T_{tot}$, is about 153 seconds. $T_{rfoff}$ is less than 153 seconds, the total deposition time. In order for there to be a deposit of the second layer on the bottom of the via, the $T_{rfoff}$ must be less than the $T_{tot}$. When the $T_{rfoff}$ is less than the $T_{tot}$ the sputter deposition continues without the effects of the Rf biasing and the bottom of the via is coated with the sputter deposited second layer. $T_{rfon}$ is selected to give a predetermined thickness of sputter deposition on the sidewalls within the constraints of the equations given above.

EXAMPLE 2

In this example the process parameters lead to the final structure, shown in FIG. 3, where the second, Rf bias sputter deposited, layer, 11, is present on the sidewalls but not on the bottom of the via. The first layer, the liner layer, 10, is TaN/Ta and has been deposited by any means known in the art. The second, Rf bias sputtered deposited layer, 11, is copper. The Rf bias voltage for the sputter deposition is set at about 160V. The Rf bias discharge is about 1 KW. The gas used in the sputter deposition process is argon and the argon pressure is about 5 mTorr. The deposition time, $T_{tot}$, is about 153 seconds. $T_{rfoff}$ is about 153 seconds. $T_{rfon}$ is selected to give a predetermined thickness of sputter deposition on the sidewalls within the constraints of the equations given previously.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

We claim:

1. A semiconductor article comprising:
   a. a material having a via;
   b. a first layer deposited in the via, the first layer lining the via;
   c. a second layer deposited on the first layer, the second layer is deposited using Rf biased sputter deposition; wherein the first layer deposited on the bottom of the via is substantially removed during the Rf biased sputter deposition of the second layer but substantially all of the first layer deposited on the sidewalls of the via during the Rf biased sputter deposition of the second layer is unaffected.

2. The article of claim 1 where the first layer comprises a semiconductive material.

3. The article of claim 1 where the first layer comprises an insulative material.

4. The article of claim 2 where the first layer comprises a conductive material.

5. The article of claim 1 wherein the liner layer comprises TaN/Ta.

6. The article of claim 1 wherein the second layer comprises a conductive metal.

7. The article of claim 1 wherein the second layer is copper.

8. A semiconductor article comprising:
   a. a material having a via;
   b. a first layer deposited in the via, the first layer lining the via;
   c. a second liner layer deposited on the first liner layer, the second layer is deposited using Rf biased sputter deposition; wherein the first layer deposited on the bottom of the via is substantially removed during the Rf biased sputter deposition of the second layer but substantially all of the first layer deposited on the sidewalls of the via during the Rf biased sputter deposition of the second layer is unaffected and wherein the second liner layer is also substantially removed from the bottom of the via during the sputter deposition.

9. The article of claim 8 where the first layer comprises a conductive material.

10. The article of claim 9 wherein the liner layer comprises TaN/Ta.

11. The article of claim 10 wherein the second layer comprises a conductive metal.

12. The article of claim 11 wherein the second layer is copper.

13. A semiconductor article comprising:
  a. a material having a via;
  b. a first layer deposited in the via, the first layer lining the via;
  c. a second liner layer deposited on the first liner layer, the second layer is deposited using Rf biased sputter deposition; wherein the first layer deposited on the bottom of the via is substantially removed during the Rf biased sputter deposition of the second layer but substantially all of the first layer deposited on the sidewalls of the via during the Rf biased sputter deposition of the second layer is unaffected.

14. The article of claim 13 where the first layer comprises a conductive material.

15. The article of claim 14 wherein the liner layer comprises TaN/Ta.

16. The article of claim 15 wherein the second layer comprises a conductive metal.

17. The article of claim 16 wherein the second layer is copper.

* * * * *